(12) United States Patent
Tetelbaum et al.

(10) Patent No.: US 7,062,737 B2
(45) Date of Patent: Jun. 13, 2006

(54) METHOD OF AUTOMATED REPAIR OF CROSSTALK VIOLATIONS AND TIMING VIOLATIONS IN AN INTEGRATED CIRCUIT DESIGN

(75) Inventors: Alexander Tetelbaum, Hayward, CA (US); Ruben Molina, San Ramon, CA (US)

(73) Assignee: LSI Logic Corporation, Milpitas, CA (US)

( * ) Notice: Subject to any disclaimer, the term of this patent is extended or adjusted under 35 U.S.C. 154(b) by 166 days.

(21) Appl. No.: 10/901,841

(22) Filed: Jul. 28, 2004

(65) Prior Publication Data
US 2006/0026539 A1 Feb. 2, 2006

(51) Int. Cl.
G06F 17/50 (2006.01)

(52) U.S. Cl. ............................. 716/6; 716/13; 716/14

(58) Field of Classification Search ................. 716/6, 716/13, 14
See application file for complete search history.

(56) References Cited

U.S. PATENT DOCUMENTS

| | | | |
|---|---|---|---|
| 6,378,109 B1 * | 4/2002 | Young et al. | 716/4 |
| 6,480,998 B1 * | 11/2002 | Mukherjee et al. | 716/13 |
| 6,499,131 B1 | 12/2002 | Savithri et al. | |
| 6,810,505 B1 * | 10/2004 | Tetelbaum et al. | 716/1 |
| 6,907,590 B1 * | 6/2005 | Al-Dabagh et al. | 716/6 |
| 2004/0103386 A1 * | 5/2004 | Becer et al. | 716/13 |

* cited by examiner

Primary Examiner—Paul Dinh
Assistant Examiner—Binh Tat
(74) Attorney, Agent, or Firm—Fitch, Even, Tabin & Flannery

(57) ABSTRACT

A method and computer program are disclosed for automatically repairing crosstalk violations in an integrated circuit design that include steps of: (a) receiving as input an integrated circuit design; (b) performing an initial cell placement and global routing from the integrated circuit design; (c) identifying nets having crosstalk violations according to a first set of rules from the initial cell placement and global routing; (d) performing a detailed routing that includes providing crosstalk protection for the nets identified in step (c); (e) identifying nets having crosstalk violations according to a second set of rules from the detailed routing; and (f) performing an additional detailed routing that includes providing crosstalk protection for the nets identified in step (e).

22 Claims, 9 Drawing Sheets

METHOD OF AUTOMATED REPAIR OF CROSSTALK VIOLATIONS AND TIMING VIOLATIONS IN AN INTEGRATED CIRCUIT DESIGN

BACKGROUND OF THE INVENTION

1. Field of the Invention

The present invention relates generally to the design of integrated circuits. More specifically, but without limitation thereto, the present invention relates to methods of avoiding crosstalk during placement and routing of an integrated circuit design.

2. Description of the Prior Art

With the dramatic increase in very large scale integrated circuit (VLSI) chip gate counts and circuit density, circuit noise resulting from crosstalk interference is becoming increasingly significant. Noise analysis is an important step in the design flow of integrated circuits, because crosstalk interference may result in false switching and failure of the design to meet performance specifications. Computer software tools have been developed for analyzing crosstalk noise, however, these tools may not be suitable for a variety of applications. Such tools generally require preparation of several special input files that require other software tools, which increases the turnaround time (TAT). The accuracy of the noise calculations is also limited by the accuracy of the software tools used to prepare the special input files.

SUMMARY OF THE INVENTION

In one embodiment of the present invention, a method includes steps of:
(a) receiving as input an integrated circuit design;
(b) performing an initial cell placement and global routing from the integrated circuit design;
(c) identifying nets having crosstalk violations according to a first set of rules from the initial cell placement and global routing;
(d) performing a detailed routing that includes providing crosstalk protection for the nets identified in step (c);
(e) identifying nets having crosstalk violations according to a second set of rules from the detailed routing; and
(f) performing an additional detailed routing that includes providing crosstalk protection for the nets identified in step (e).

In another aspect of the present invention, a computer program product for automatically repairing crosstalk violations in an integrated circuit design includes a medium for embodying a computer program for input to a computer and a computer program embodied in the medium for causing the computer to perform steps of:
(a) receiving as input an integrated circuit design;
(b) performing an initial cell placement and global routing from the integrated circuit design;
(c) identifying nets having crosstalk violations according to a first set of rules from the initial cell placement and global routing;
(d) performing a detailed routing that includes providing crosstalk protection for the nets identified in step (c);
(e) identifying nets having crosstalk violations according to a second set of rules from the detailed routing; and
(f) performing an additional detailed routing that includes providing crosstalk protection for the nets identified in step (e).

DESCRIPTION OF THE DRAWINGS

The present invention is illustrated by way of example and not limitation in the accompanying figures, in which like references indicate similar elements throughout the several views of the drawings.

DESCRIPTION OF THE ILLUSTRATED EMBODIMENTS

Figure 1:
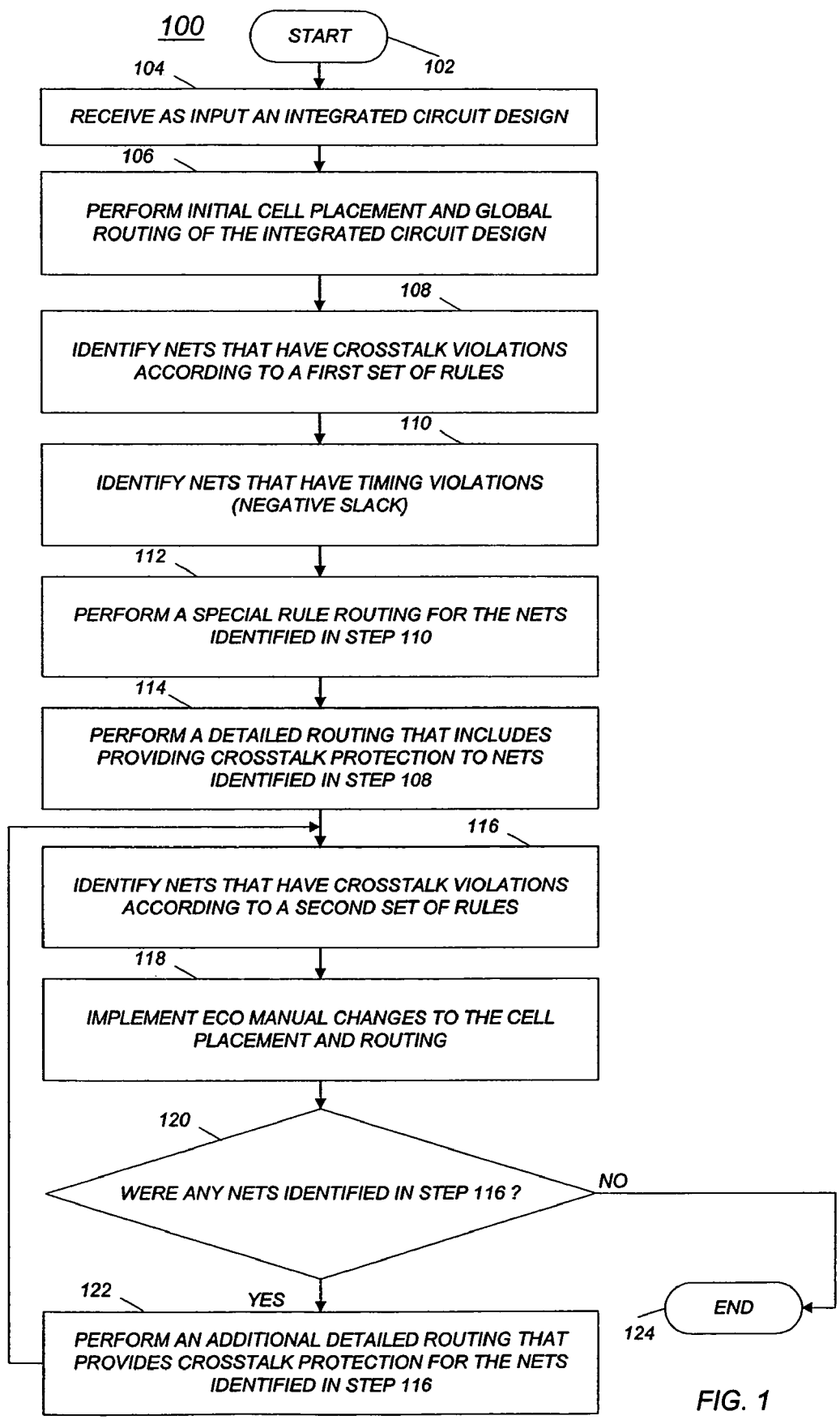
FIG. 1 illustrates a flow chart of a method of automatically repairing crosstalk violations in an integrated circuit design according to an embodiment of the present invention.

One of the most significant factors that may affect signal or clock arrival time, or propagation delay, in a selected signal net or clock tree net of an integrated circuit design is the crosstalk noise generated from signals carried in wires adjacent to the selected net, or victim net. The crosstalk noise may inject an incremental crosstalk delay (positive or negative) in the victim net. In previous design flows, the net implementation is designed and a crosstalk analysis is performed afterward to determine whether the crosstalk results in any timing violations in the net. If timing violations are found, the net design is modified, and another crosstalk analysis is performed. This cycle is iterated until all timing violations are removed, which may be an extremely time-consuming process.

Crosstalk noise is generally capacitively coupled between traces in an integrated circuit and is most significant when the sources of the crosstalk, commonly referred to as aggressor nets, or "aggressors", have a fast switching waveform. The switching waveforms of one or more aggressor nets are coupled by parasitic coupling capacitances to a net that is commonly referred to as a victim net or "victim". Crosstalk noise may cause a change in propagation delay in the victim net and consequent failure of the integrated circuit design to meet timing specifications. For example, depending on the waveform of the signal in the aggressor nets, the crosstalk noise may inject a positive or negative delay in the victim net.

Previous methods for avoiding crosstalk in integrated circuit designs may report nets that have a net length greater than the critical length of the driver cells during placement. However, these methods may not make corrections during placement to avoid crosstalk due to critical net length. A path is timing critical to the setup time requirement if the propagation delay of the path is more than an empirical threshold, typically about 90 percent, of the clock period. A path is usually timing critical to setup time if the path includes a large number of cells, typically 40 to 70, and if the average wire length between cells is more than a small value, for example, 200 microns. A path may also be timing critical to setup time if the path includes an average number of cells, typically 25 to 30, and if the average wire length between cells is more than a large value, for example, 500 microns. A path is timing critical to hold time if the propagation delay of the path is less than an empirical threshold, typically about 10 percent, of the clock period. A path is usually timing critical to hold time if the path includes a small number of cells, typically 0 to 5, and the average wire length between cells is less than a small value, for example, 200 microns.

A timing critical net is a net that belongs to a timing critical path. All other nets are timing non-critical nets. Timing critical nets may result in severe crosstalk delays. Also, delay estimates for timing critical nets that are based on coupling capacitance multipliers may be extremely inaccurate, if the nets have lengths that are much greater than the critical length.

Previous methods for avoiding crosstalk include reporting noise violations and timing violations after cell placement and detailed routing, however, these methods generally require that the noise and timing violations be corrected manually. As a consequence of these corrections, net drivers may be downsized, and net lengths may be increased by design engineers during manual engineering change orders (ECO), resulting in crosstalk noise problems that may not be reported. Another disadvantage of previous methods for closing timing in an integrated circuit design is that manually correcting crosstalk noise problems is a time consuming and error prone process.

The present invention overcomes the disadvantages of the previous methods described above by providing a method of closing timing that ensures that all timing and noise violations are reported and automatically corrected.

In one embodiment of the present invention, a method includes steps of:
 (a) receiving as input an integrated circuit design;
 (b) performing an initial cell placement and global routing from the integrated circuit design;
 (c) identifying nets having crosstalk violations according to a first set of rules from the initial cell placement and global routing;
 (d) performing a detailed routing that includes providing crosstalk protection for the nets identified in step (c);
 (e) identifying nets having crosstalk violations according to a second set of rules from the detailed routing; and
 (f) performing an additional detailed routing that includes providing crosstalk protection for the nets identified in step (e).

FIG. 1 illustrates a flow chart 100 of a method of automatically repairing crosstalk violations in an integrated circuit design according to an embodiment of the present invention.

Step 102 is the entry point of the flow chart 100.

In step 104, an integrated circuit design is received as input, for example, from a netlist according to well known techniques.

In step 106, an initial cell placement and global routing of the integrated circuit design are performed according to well known techniques.

In step 108, nets having crosstalk violations according to a first set of rules are identified from the initial cell placement and global routing of the integrated circuit design before performing detailed routing.

The first set of rules for identifying nets having crosstalk violations uses information about the integrated circuit design that is available from the initial cell placement and global routing. An exemplary first set of rules is described as follows. Nets that are at risk for crosstalk violations are assigned to two categories: time critical and time non-critical.

Time critical nets with length ratio violation are nets having a ratio of net length to critical net length that is greater than a selected critical length ratio. The selected critical length ratio may be determined by experiment and is preferably given a conservative value to avoid a high level of crosstalk interference, for example 2.5. The selected critical length ratio may be stored in a technology library and updated as necessary to increase or decrease the amount of crosstalk protection.

Time non-critical nets with length ratio violation are nets having a ratio of net length to critical net length that is greater than a selected non-critical length ratio. The selected non-critical length ratio may be determined by experiment and is preferably given a conservative value to avoid a high level of crosstalk interference, for example 3.0. The selected non-critical length ratio may be stored in a technology library and updated as necessary to increase or decrease the amount of crosstalk protection.

Time critical nets with length ratio violation have a higher sensitivity to crosstalk interference than time non-critical nets with length ratio violation, therefore time critical nets with length ratio violation are preferably given a higher priority for crosstalk protection. A first list is created of the net names of the time critical nets with length ratio violation in the first category, for example, in a computer readable file format. A second list is likewise created of the net names of the time non-critical nets with length ratio violation in the second category. If the initial cell placement and routing includes some crosstalk avoidance provision, then the two lists should have few entries.

In step 110, nets that have timing violations, that is, nets that belong to paths having negative timing slack, are identified according to well known techniques, for example, by performing a circuit analysis using a circuit simulation program at gate level.

In step 112, a detailed routing is performed that includes special rule routing of the nets identified in step 110. The special rule routing for nets having timing violations includes, for example, additional spacing and/or shielding as for nets having crosstalk violations, and also increasing trace width to reduce wire resistance and the corresponding net delay.

In step 114, a detailed routing is performed that includes special routing of the nets identified as having crosstalk violations in step 108. In contrast to the initial global routing, which may include some provisions for crosstalk avoidance, the special routing actually corrects crosstalk violations identified in step 108. The detailed routing includes providing crosstalk protection such as additional spacing or other suitable crosstalk protection for all of the nets identified in step 108. Providing crosstalk protection for nets identified as having crosstalk violations during detailed routing advantageously reduces the number of nets that may still be at risk for crosstalk violations after detailed routing and is an important feature of the method of the present invention.

In step 116, nets having crosstalk violations are identified according to a second set of rules. An exemplary second set of rules for identifying nets having crosstalk violations is described as follows. Nets that are at risk for crosstalk violations are assigned to four additional categories: noise critical nets having noise violations, noise non-critical nets having noise violations, time critical nets with multiple factor violations, and time non-critical nets with multiple factor violations.

A noise critical net is identified as having a noise violation if the ratio of noise glitch peak magnitude to supply voltage exceeds a selected critical noise glitch peak magnitude ratio, for example, 48 percent. Noise critical nets are nets that drive inputs to flip-flops or latches, for example.

Nets that are not noise critical nets are noise non-critical nets. A noise non-critical net is identified as having a noise violation if the ratio of noise glitch peak magnitude to supply voltage exceeds a selected non-critical noise glitch peak magnitude ratio, for example, 52 percent.

Time critical nets with multiple factor violations are time critical nets that exceed multiple net rules, for example, nets that have a ratio of net length to critical length that exceeds a selected critical length ratio and a ratio of coupling capacitance to total net capacitance that exceeds a selected critical coupling capacitance ratio and a ratio of glitch peak magnitude to supply voltage that exceeds a selected glitch peak magnitude ratio.

Time non-critical nets with multiple factor violations are time non-critical nets that have a ratio of net length to critical length that exceeds the non-critical length ratio, a ratio of coupling capacitance to total net capacitance that exceeds a selected non-critical coupling capacitance ratio, and a ratio of glitch peak magnitude to supply voltage that exceeds a selected glitch peak magnitude ratio. A glitch is a noise spike that is induced in a victim net by an aggressor net. The glitch peak magnitude is usually available after detailed routing, however, if the glitch peak magnitude is not available, then the ratio of glitch peak magnitude to supply voltage may be approximated, for example, by the formula:

$$M \approx (S\_max + Sa - S)/(2 * S\_max) \quad (1)$$

where S is the net driver strength for the victim net, Sa is the average aggressor net driver strength, and S_max is the maximum driver strength among all cells in the cell library for the desired technology.

A list of net names is created for each category of nets that are identified as noise critical nets having noise violations, noise non-critical nets having noise violations, time critical nets with multiple factor violations, and time non-critical nets with multiple factor violations, for example, in a computer readable file format.

In step 118, manual changes to the cell placement and routing may be requested by the circuit designer. If manual changes to the cell placement and routing are requested, then engineering change orders (ECO) are implemented in the layout. The manual changes may introduce additional timing violations that have to be corrected.

In step 120, if any nets were identified in step 116, then the next step continues from step 118. Otherwise, the next step continues from step 120.

In step 122, an additional detailed routing is performed that provides crosstalk protection such as additional spacing or other suitable crosstalk protection for the nets identified in step 116. The next step continues from step 116 to ensure that no nets remain having crosstalk violations.

Step 124 is the exit point of the flow chart 100.

Figure 2:
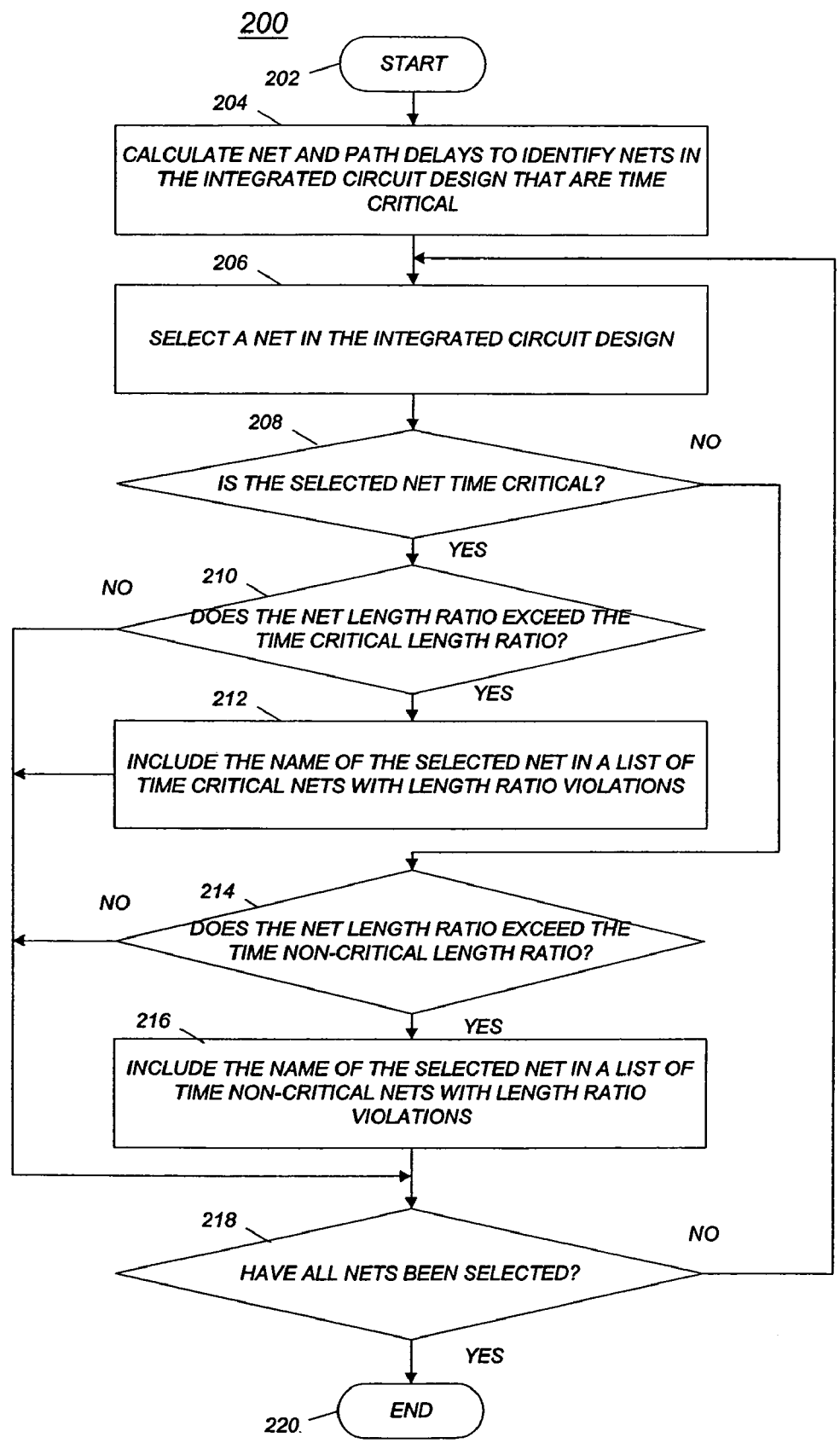
FIG. 2 illustrates a flow chart of a method of identifying nets having crosstalk violations according to a first set of rules in FIG. 1.

FIG. 2 illustrates a flow chart 200 of a method of identifying nets that having crosstalk violations according to a first set of rules in FIG. 1.

Step 202 is the entry point of the flow chart 200.

In step 204, an analysis is performed according to well known techniques, for example, using a circuit simulation program at gate level, to calculate net and path delays to identify nets in the integrated circuit design that are time critical.

In step 206, a net in the integrated circuit design is selected.

In step 208, if the selected net is time critical, then the next step continues from step 210. Otherwise, the next step continues from step 214.

In step 210, the ratio of net length to critical length of the selected net is compared to a selected time critical length ratio, for example, 2.5. If the net length ratio exceeds the time critical length ratio, then the next step continues from step 212; otherwise the next step continues from step 218.

In step 212, the name of the selected net is included in a list of time critical nets having a length ratio violation, and the next step continues from step 216. The list may be implemented, for example, as a computer file.

In step 214, the ratio of net length to critical length of the selected net is compared to a selected time non-critical length ratio, for example, 3.0. If the net length ratio exceeds the time non-critical length ratio, then the next step continues from step 216; otherwise the next step continues from step 218.

In step 216, the name of the selected net is included in a list of time non-critical nets having a length ratio violation. The list may be implemented, for example, as a computer file.

In step 218, if all nets in the integrated circuit design have been selected, then the next step continues from step 220. Otherwise, the next step continues from step 206.

Step 220 is the exit point of the flow chart 200.

An example of a second set of rules that may be used to identify nets having crosstalk violations without calculating incremental crosstalk delays is described as follows.

Figure 3A:
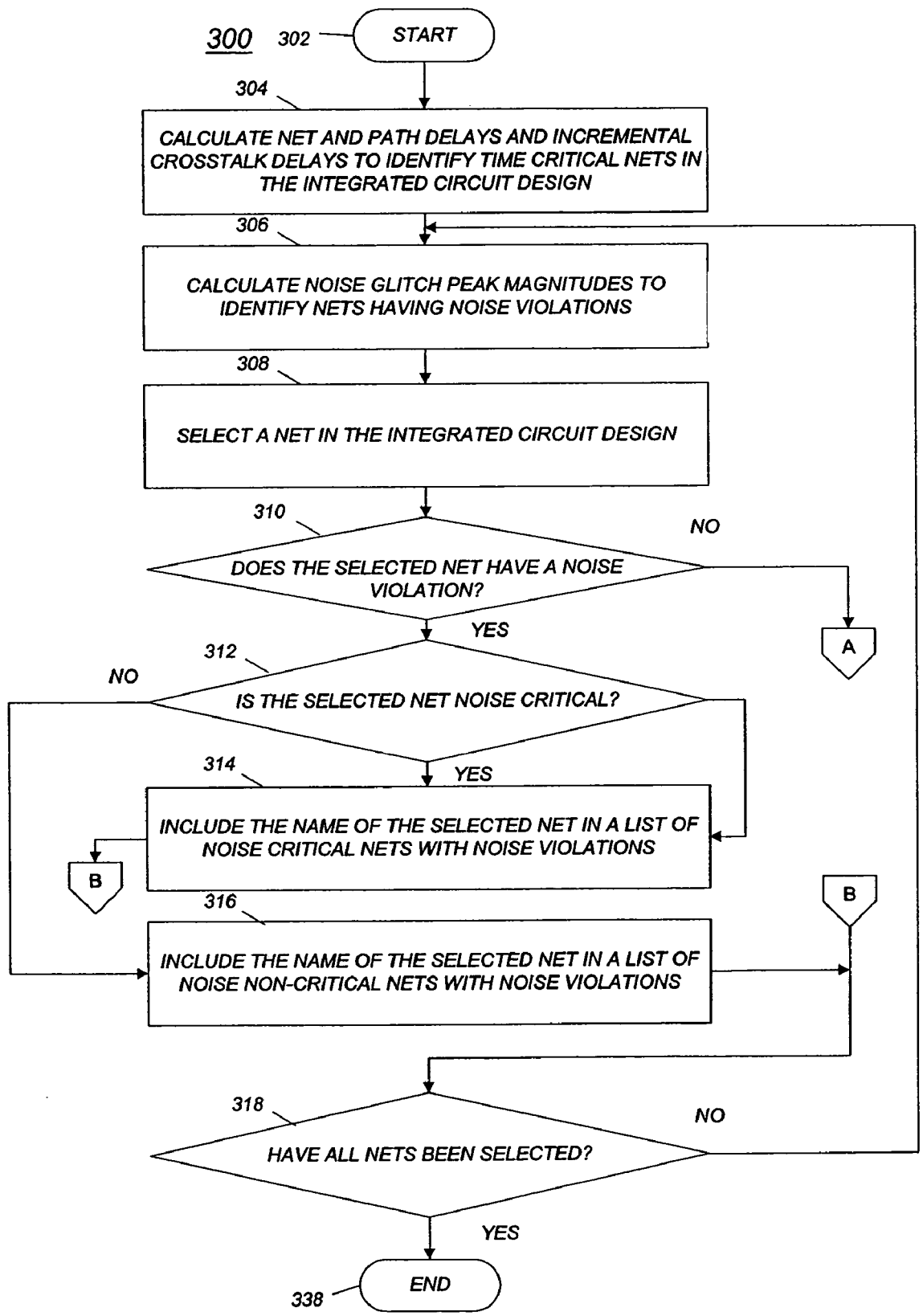
FIGS. 3A, 3B and 3C illustrate a flow chart of a method of identifying nets having crosstalk violations according to a second set of rules in FIG. 1 without using incremental crosstalk delay information.
Figure 3B:
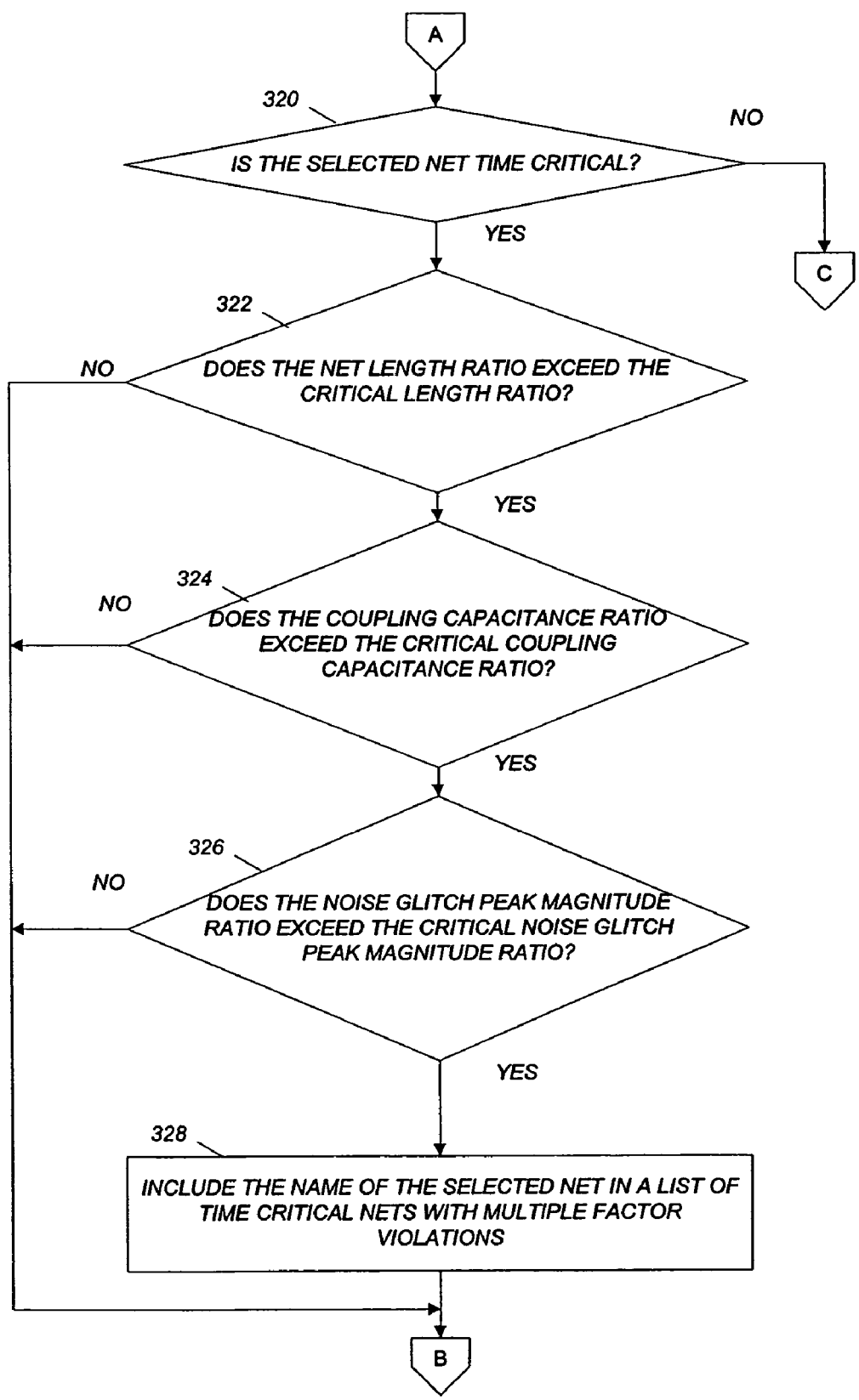
Figure 3C:
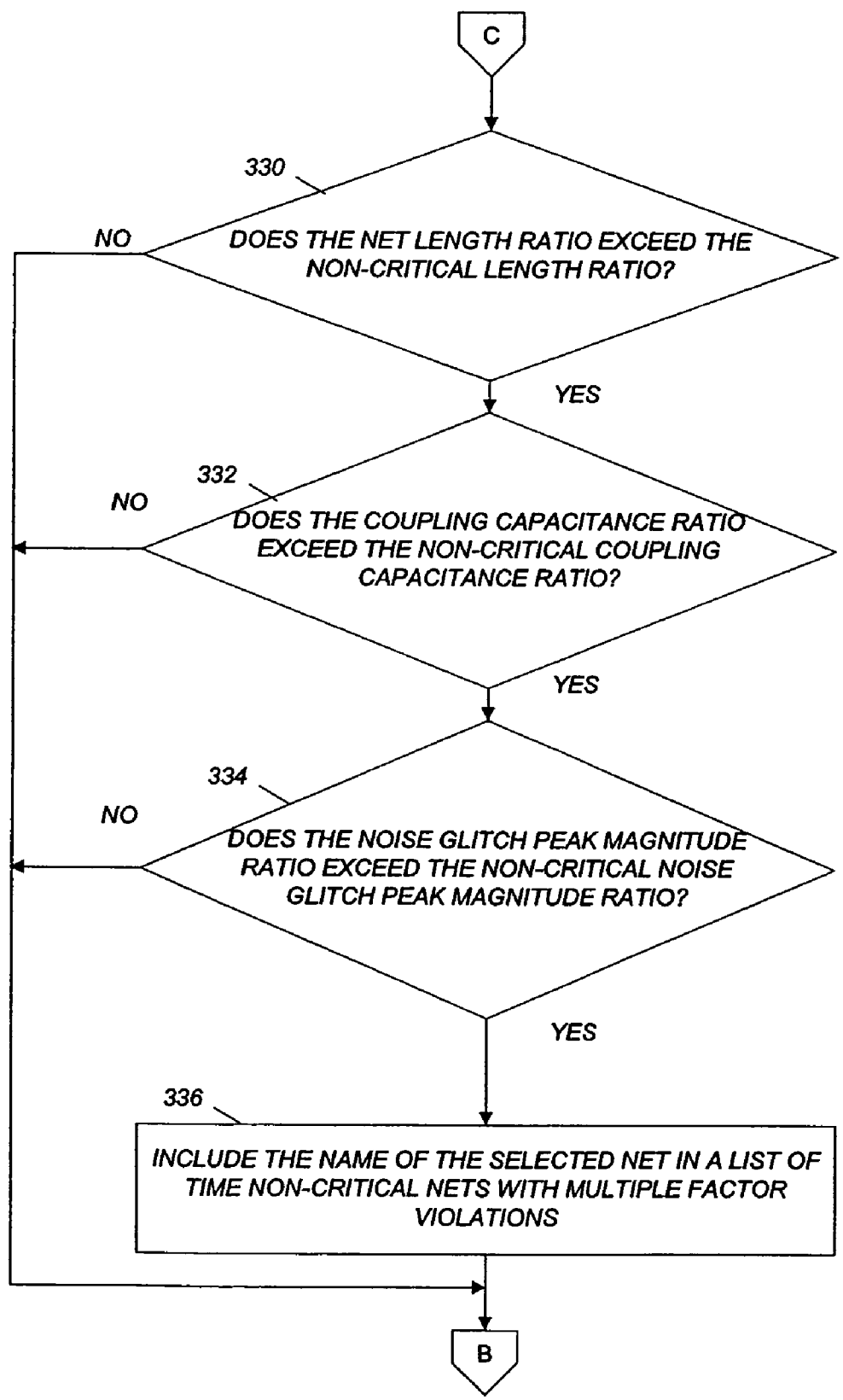

FIGS. 3A, 3B, and 3C illustrate a flow chart 300 of a method of identifying nets having crosstalk violations according to a second set of rules in FIG. 1 without using incremental crosstalk delay information.

Step 302 is the entry point of the flow chart 300.

In step 304, an analysis is performed according to well known techniques, for example, using a circuit simulation program at gate level, to calculate net and path delays and incremental crosstalk delays to identify time critical nets in the integrated circuit design.

In step 306, noise glitch peak magnitudes are calculated according to well known techniques from the circuit analysis to identify nets having noise violations.

In step 308, a net in the integrated circuit design is selected.

In step 310, if the selected net has a noise violation, then the next step continues from step 312. Otherwise, the next step continues from step 318.

In step 312, if the selected net is noise critical, for example, if the selected net precedes a flip-flop, latch, or memory, then the next step continues from step 314. Otherwise, the next step continues from step 316.

In step 314, the name of the selected net is included in a list of noise critical nets having a noise violation, and the next step continues from step 318. The list may be implemented, for example, as a computer file as described above for the lists of net names for nets having crosstalk violations.

In step 316, the name of the selected net is included in a list of noise non-critical nets having a noise violations.

In step 318, if all nets have been selected, then the next step continues from step 338. Otherwise, the next step continues from step 306.

In step 320, if the selected net is time critical, then the next step continues from step 322. Otherwise, the next step continues from step 330.

In step 322, the ratio of net length to critical length of the selected net is compared to a selected time critical length ratio, for example, 2.5. If the net length ratio exceeds the timing critical length ratio, then the next step continues from step 324; otherwise the next step continues from step 318.

In step 324, the ratio of coupling capacitance to total net capacitance of the selected net is compared to a selected critical coupling capacitance ratio, for example, 0.3. If the ratio of coupling capacitance to total net capacitance of the selected net exceeds the critical coupling capacitance ratio, then the next step continues from step 326. Otherwise, the next step continues from step 318.

In step 326, the ratio of noise glitch peak magnitude to supply voltage of the selected net is compared to a selected critical noise glitch peak magnitude ratio, for example, 0.3. If the ratio of glitch peak magnitude to supply voltage of the selected net exceeds the critical glitch peak magnitude ratio, then the next step continues from step 328. Otherwise, the next step continues from step 336.

In step 328, the name of the selected net is included in a list of time critical nets with multiple factor violations, and the next step continues from step 318.

In step 330, the ratio of net length to critical length of the selected net is compared to a selected time non-critical length ratio, for example, 3.0. If the net length ratio exceeds the timing non-critical length ratio, then the next step continues from step 332; otherwise the next step continues from step 318.

In step 332, the ratio of coupling capacitance to total net capacitance of the selected net is compared to a selected non-critical coupling capacitance ratio, for example, 0.35. If the ratio of coupling capacitance to total net capacitance of the selected net exceeds the critical coupling capacitance ratio, then the next step continues from step 334. Otherwise, the next step continues from step 318.

In step 334, the ratio of noise glitch peak magnitude to supply voltage of the selected net is compared to a selected non-critical noise glitch peak magnitude ratio, for example, 0.35. If the ratio of glitch peak magnitude to supply voltage of the selected net exceeds the selected non-critical noise glitch peak magnitude ratio, then the next step continues from step 336. Otherwise, the next step continues from step 318.

In step 336, the name of the selected net is included in a list of time non-critical nets with multiple factor violations, and the next step continues from step 318.

Step 338 is the exit point of the flow chart 300.

An example of a second set of rules that may be used to identify nets having crosstalk violations that uses incremental crosstalk delay information is described as follows.

Figure 4A:
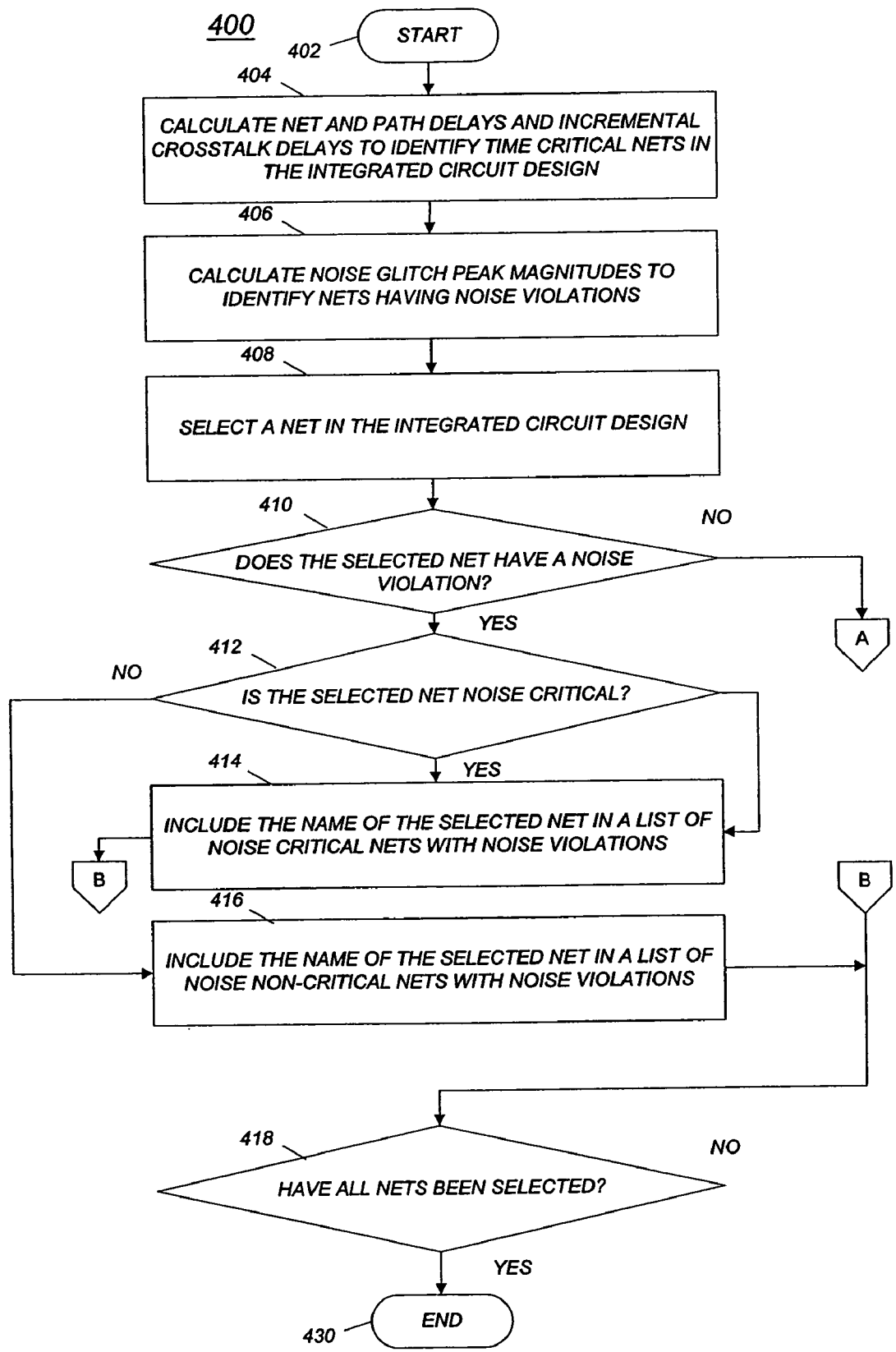
FIGS. 4A and 4B illustrate a flow chart of a method of identifying nets having crosstalk violations according to a second set of rules in FIG. 1 using incremental crosstalk delay information.
Figure 4B:
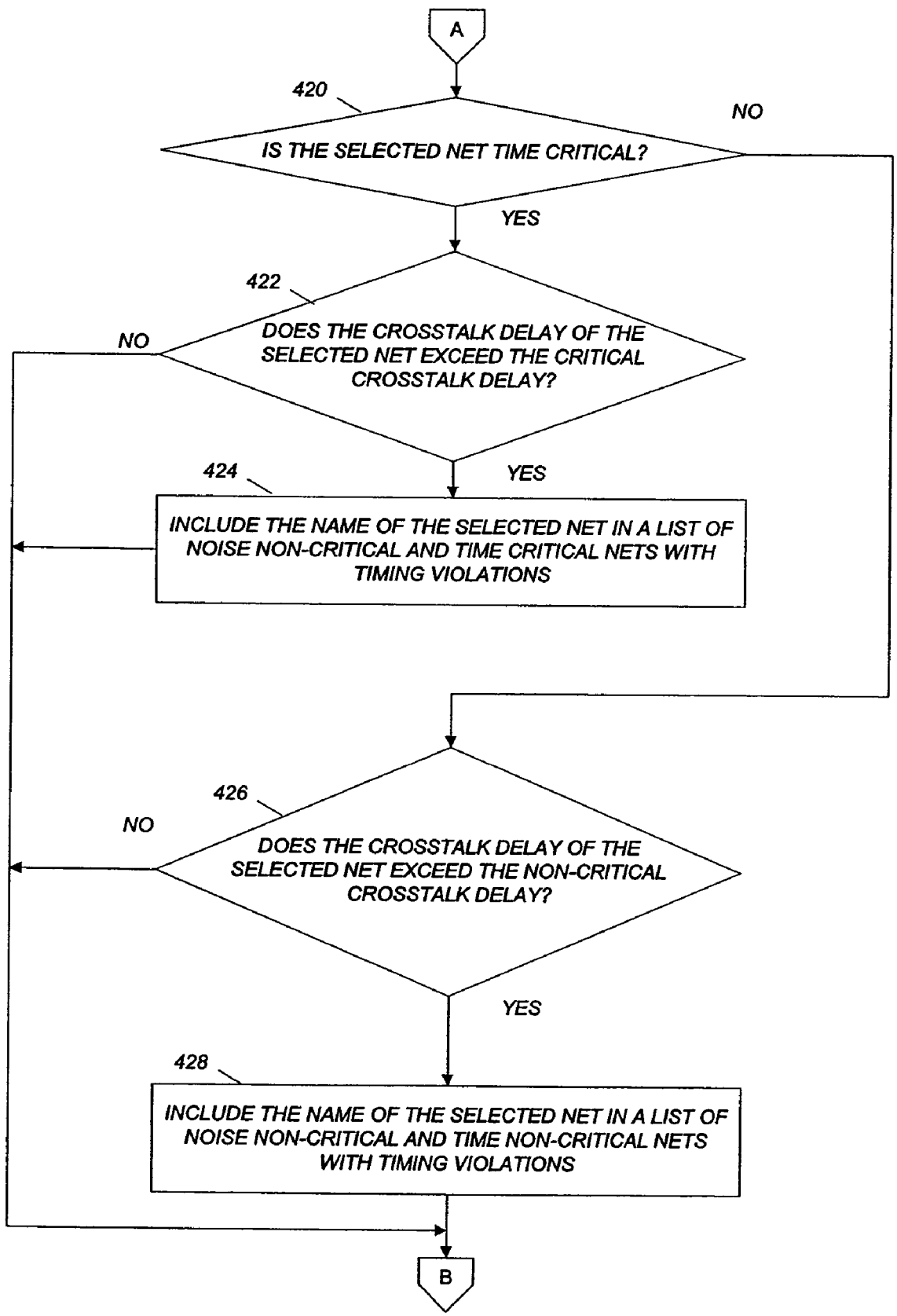

FIGS. 4A and 4B illustrate a flow chart 400 of a method of identifying nets having crosstalk violations according to a second set of rules in FIG. 1 using incremental crosstalk delay information.

Step 402 is the entry point of the flow chart 300.

In step 404, an analysis is performed according to well known techniques, for example, using a circuit simulation program at gate level, to calculate net and path delays and incremental crosstalk delays to identify time critical nets in the integrated circuit design.

In step 406, noise glitch peak magnitudes are calculated according to well known techniques from the circuit analysis to identify nets having noise violations.

In step 408, a net in the integrated circuit design is selected.

In step 410, if the selected net has a noise violation, then the next step continues from step 412. Otherwise, the next step continues from step 420.

In step 412, if the selected net is noise critical, for example, if the selected net precedes a flip-flop, latch, or memory, then the next step continues from step 414. Otherwise, the next step continues from step 416.

In step 414, the name of the selected net is included in a list of noise critical nets having a noise violation, and the next step continues from step 418. The list may be implemented, for example, as a computer file having the same format as described above for the lists of net names for nets having crosstalk violations.

In step 416, the name of the selected net is included in a list of noise non-critical nets having a noise violation.

In step 418, if all nets in the integrated circuit design have been selected, then the next step continues from step 430. Otherwise, the next step continues from step 408.

In step 420, if the selected net is time critical, then the next step continues from step 422. Otherwise, the next step continues from step 426.

In step 422, if the crosstalk delay of the selected net exceeds a selected critical crosstalk delay, for example, 30 picoseconds, then the next step continues from step 424; otherwise the next step continues from step 418.

In step 424, the name of the selected net is included in a list of noise critical and time critical nets with timing violations, and the next step continues from step 418.

In step 426, if the crosstalk delay of the selected net exceeds a selected non-critical crosstalk delay, for example, 200 picoseconds, then the next step continues from step 428; otherwise the next step continues from step 418.

In step 428, the name of the selected net is included in a list of noise non-critical and time non-critical nets with timing violations, and the next step continues from step 418.

Step 430 is the exit point of the flow chart 400.

The methods illustrated in the flowchart descriptions above may be embodied in a computer program product and implemented by a computer according to well known programming techniques.

In another aspect of the present invention, a computer program product for automatically repairing crosstalk violations in an integrated circuit design includes a medium for embodying a computer program for input to a computer and a computer program embodied in the medium for causing the computer to perform steps of:

(a) receiving as input an integrated circuit design;
(b) performing an initial cell placement and global routing from the integrated circuit design;
(c) identifying nets having crosstalk violations according to a first set of rules from the initial cell placement and global routing;
(d) performing a detailed routing that includes providing crosstalk protection for the nets identified in step (c);
(e) identifying nets having crosstalk violations according to a second set of rules from the detailed routing; and
(f) performing an additional detailed routing that includes providing crosstalk protection for the nets identified in step (e).

Figure 5A:
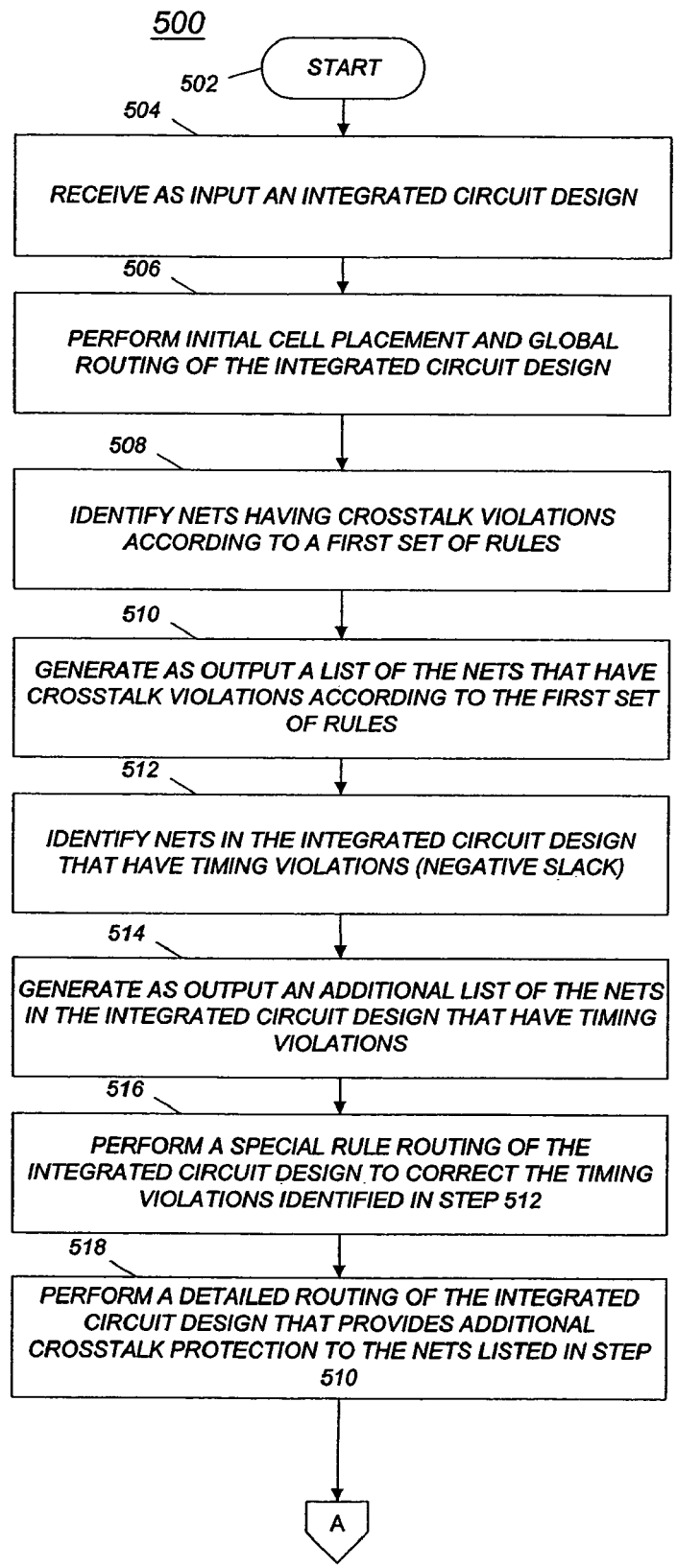
FIGS. 5A and 5B illustrate a flow chart of a method and computer program for automatically repairing crosstalk violations in an integrated circuit design according to an embodiment of the present invention.
Figure 5B:
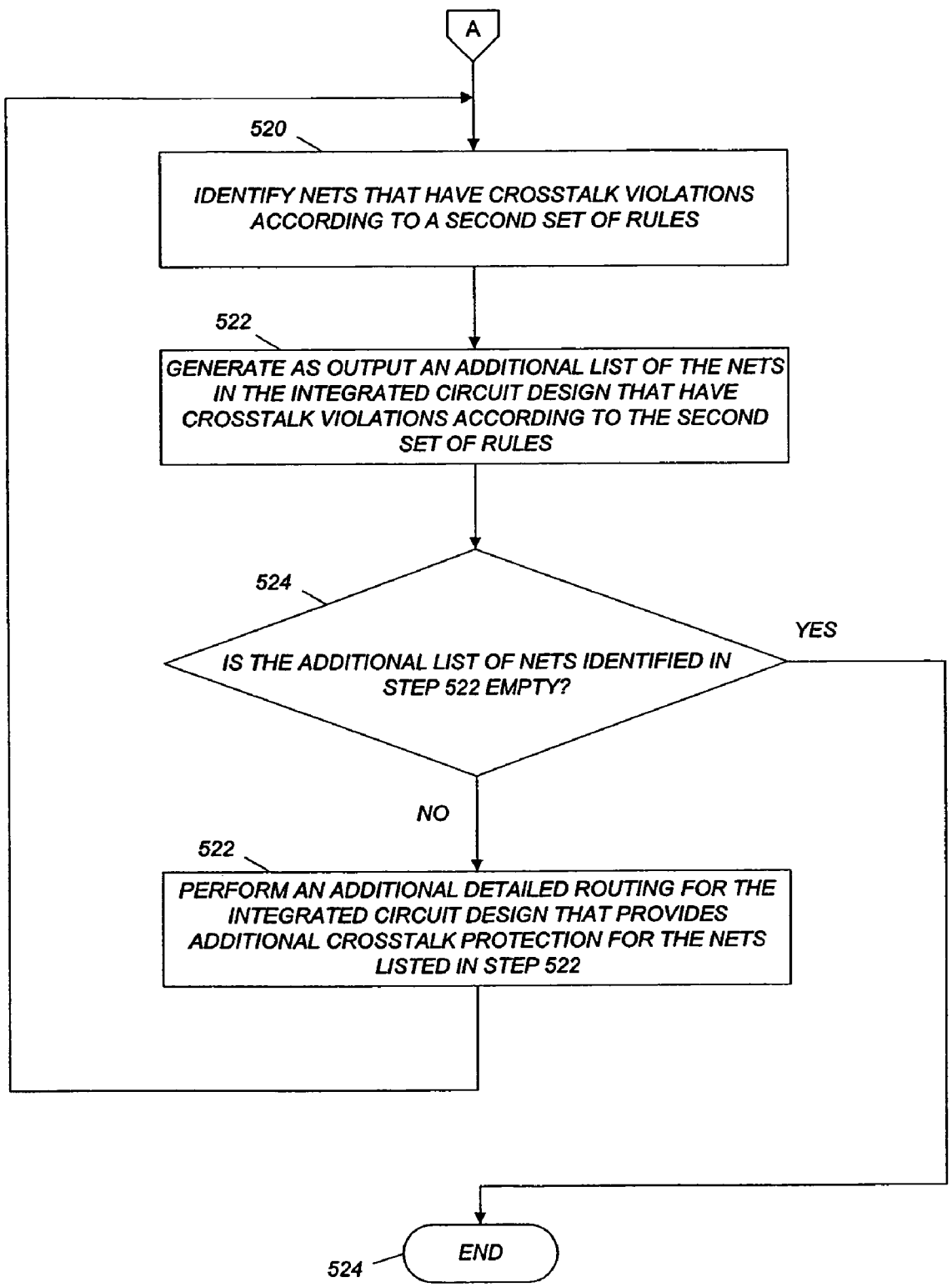

FIGS. 5A and 5B illustrate a flow chart 500 of a method and computer program for automatically repairing crosstalk violations in an integrated circuit design according to an embodiment of the present invention.

Step 502 is the entry point of the flow chart 500.

In step 504, an integrated circuit design is received as input;

In step 506, an initial cell placement and global routing is performed from the integrated circuit design according to well-known techniques.

In step 508, nets in the integrated circuit design that have crosstalk violations are identified according to a first set of rules as described above.

In step 510, a list of the nets that have crosstalk violations according to the first set of rules is generated as output.

In step 512, nets in the integrated circuit design that have timing violations, that is negative slack, are identified as described above.

In step 514, an additional list of the nets in the integrated circuit design that have timing violations is generated as output.

In step 516, a special rule routing of the integrated circuit design is performed to correct the timing violations identified in step 512.

In step 518, a detailed routing of the integrated circuit design is performed that provides additional crosstalk protection to the nets listed in step 510. The additional crosstalk protection may include, for example, spacing the nets named in the list further apart from aggressor nets.

In step 520, nets that have crosstalk violations are identified according to a second set of rules as described above.

In step 522, an additional list of the nets in the integrated circuit design that have crosstalk violations according to the second set of rules is generated as output.

In step 524, engineering change orders (ECOs) may be implemented as requested by the circuit designer, including manual changes entered by the circuit designer.

In step 526, if the additional list of nets identified in step 522 is empty, then the next step continues from step 530. Otherwise, the next step continues from step 528.

In step 528, an additional detailed routing is performed for the integrated circuit design that provides additional crosstalk protection for the nets listed in step 522. The next step continues from step 520 until all crosstalk violations have been corrected.

Step 528 is the exit point of the flow chart 500.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:
   (a) receiving as input an integrated circuit design;
   (b) performing an initial cell placement and global routing from the integrated circuit design;
   (c) identifying nets having crosstalk violations according to a first set of rules from the initial cell placement and global routing;
   (d) performing a detailed routing that includes providing crosstalk protection for the nets identified in step (c);
   (e) identifying nets having crosstalk violations according to a second set of rules from the detailed routing; and
   (f) performing an additional detailed routing that includes providing crosstalk protection for the nets identified in step (e).

2. The method of claim 1 wherein the first set of rules includes identifying time critical nets and time non-critical nets.

3. The method of claim 1 wherein the additional crosstalk protection includes increasing spacing between the nets having crosstalk violations and aggressor nets.

4. The method of claim 1 wherein the second set of rules includes identifying noise critical nets having noise violations, noise non-critical nets having noise violations, noise critical nets having timing violations, and noise non-critical nets having timing violations.

5. The method of claim 1 wherein the second set of rules includes identifying noise critical nets having noise violations, noise non-critical nets having noise violations, time critical nets with multiple factor violations, and time non-critical nets with multiple factor violations.

6. The method of claim 5 wherein the time critical nets with multiple factor violations and the time non-critical nets with multiple factor violations are identified by determining whether a net length ratio exceeds a selected critical length ratio and a selected non-critical length ratio.

7. The method of claim 6 wherein the time critical nets with multiple factor violations and the time non-critical nets with multiple factor violations are identified by determining whether a net coupling capacitance ratio exceeds a selected critical coupling capacitance ratio and a selected non-critical coupling capacitance ratio.

8. The method of claim 7 wherein the time critical nets with multiple factor violations and the time non-critical nets with multiple factor violations are identified by determining whether a noise glitch peak magnitude ratio exceeds a selected critical noise glitch peak magnitude ratio and a selected non-critical noise glitch peak magnitude ratio.

9. The method of claim 1 further comprising a step of implementing changes to the integrated circuit design from an engineering change order prior to step (f).

10. The method of claim 1 wherein step (c) further comprises a step of identifying nets having timing violations.

11. The method of claim 10 wherein step (d) further comprises a step of performing a detailed routing that includes providing special rule routing for the nets having timing violations.

12. A computer program product for automatically repairing crosstalk violations in an integrated circuit design comprising a medium for embodying a computer program for input to a computer and a computer program embodied in the medium for causing the computer to perform steps of:
   (a) receiving as input an integrated circuit design;
   (b) performing an initial cell placement and global routing from the integrated circuit design;
   (c) identifying nets having crosstalk violations according to a first set of rules from the initial cell placement and global routing;
   (d) performing a detailed routing that includes providing crosstalk protection for the nets identified in step (c);
   (e) identifying nets having crosstalk violations according to a second set of rules from the detailed routing; and
   (f) performing an additional detailed routing that includes providing crosstalk protection for the nets identified in step (e).

13. The computer program product of claim 12 wherein the first set of rules includes identifying time critical nets and time non-critical nets.

14. The computer program product of claim 12 wherein the additional crosstalk protection includes increasing spacing between the nets having crosstalk violations and aggressor nets.

15. The computer program product of claim 12 wherein the second set of rules includes identifying noise critical nets having noise violations, noise non-critical nets having noise violations, noise critical nets having timing violations, and noise non-critical nets having timing violations.

16. The computer program product of claim 12 wherein the second set of rules includes identifying noise critical nets having noise violations, noise non-critical nets having noise violations, multiple factor time critical nets, and time critical nets with multiple factor violations and time non-critical nets with multiple factor violations.

17. The computer program product of claim 16 wherein the time critical nets with multiple factor violations and the time non-critical nets with multiple factor violations are identified by determining whether a net length ratio exceeds a selected critical length ratio.

18. The computer program product of claim 17 wherein the time critical nets with multiple factor violations and the time non-critical nets with multiple factor violations are identified by determining whether a net coupling capacitance ratio exceeds a selected critical coupling capacitance ratio.

19. The computer program product of claim 18 wherein the time critical nets with multiple factor violations and the time non-critical nets with multiple factor violations are identified by determining whether a noise glitch peak magnitude ratio exceeds a selected critical noise glitch peak magnitude ratio and a selected non-critical noise glitch peak magnitude ratio.

20. The computer program product of claim 18 further comprising a step of implementing changes to the integrated circuit design from an engineering change order prior to step (f).

21. The computer program product of claim 12 wherein step (c) further comprises a step of identifying nets having timing violations.

22. The computer program product of claim 21 wherein step (d) further comprises a step of performing a detailed routing that includes providing special rule routing for the nets having timing violations.

* * * * *